(12) United States Patent
Jung et al.

(10) Patent No.: US 11,752,530 B2
(45) Date of Patent: Sep. 12, 2023

(54) FLUID DISCHARGING DEVICE, SUBSTRATE PROCESSING SYSTEM INCLUDING SAME, AND FLUID DISCHARGING METHOD THEREOF

(71) Applicant: SEMES CO., LTD., Cheonan-si (KR)

(72) Inventors: Woo Sin Jung, Yeoju-si (KR); Sang Eun Noh, Pohang-si (KR); Dae Sung Kim, Ansan-si (KR)

(73) Assignee: SEMES CO., LTD., Cheonan-si (KR)

( * ) Notice: Subject to any disclaimer, the term of this patent is extended or adjusted under 35 U.S.C. 154(b) by 182 days.

(21) Appl. No.: 17/073,338

(22) Filed: Oct. 17, 2020

(65) Prior Publication Data

US 2021/0114068 A1 Apr. 22, 2021

(30) Foreign Application Priority Data

Oct. 18, 2019 (KR) .................. 10-2019-0130046

(51) Int. Cl.
*B08B 3/14* (2006.01)
*B08B 3/12* (2006.01)
*B08B 13/00* (2006.01)
*H01L 21/02* (2006.01)

(52) U.S. Cl.
CPC .................. *B08B 3/14* (2013.01); *B08B 3/12* (2013.01); *B08B 13/00* (2013.01); *H01L 21/02057* (2013.01)

(58) Field of Classification Search
CPC .. B08B 3/14; B08B 3/12; B08B 13/00; B08B 7/02; B08B 9/027; H01L 21/02057; H01L 21/67017; H01L 21/67253; H01L 21/02052; H01L 21/02343; H01L 21/67028; H01L 21/67242; H01L 22/20
See application file for complete search history.

(56) References Cited

U.S. PATENT DOCUMENTS

| | | | |
|---|---|---|---|
| 5,113,789 A * | 5/1992 | Kamian | C23C 16/545 118/733 |
| 5,846,275 A * | 12/1998 | Lane | B01D 45/00 406/48 |
| 5,935,283 A * | 8/1999 | Sweeney | B01D 45/00 406/48 |
| 6,368,567 B2 | 4/2002 | Comita et al. | |
| 10,022,758 B2 | 7/2018 | Okumura et al. | |
| 2002/0070297 A1* | 6/2002 | Bolinis | A01G 25/023 239/542 |

(Continued)

FOREIGN PATENT DOCUMENTS

| | | |
|---|---|---|
| JP | H9-150123 | 6/1997 |
| JP | 2002-526660 A | 8/2002 |
| JP | 2019-80003 | 5/2019 |

(Continued)

OTHER PUBLICATIONS

KR-2013-0014804-A (Year: 2013).*

*Primary Examiner* — Alexander Markoff (57) ABSTRACT

A fluid discharging device includes a body member including an entrance configured to receive fluid and a passage line through which the fluid is transferred to a chamber, and a first foreign material removing unit coupled to the body member, and expanding and restoring such that foreign materials accumulated on a surface of the first foreign material removing unit is removed.

20 Claims, 9 Drawing Sheets

(56) References Cited

U.S. PATENT DOCUMENTS

2008/0047578 A1* 2/2008 Yoo .................. B08B 9/027
                                              134/1.1
2022/0282871 A1* 9/2022 Garcia ................ F24C 15/322

FOREIGN PATENT DOCUMENTS

| KR | 10-0922769 B1 | | 10/2009 | |
|----|---------------|---|---------|---|
| KR | 2013-0014804 A | * | 2/2013 | |
| KR | 10-2015-0103531 A | | 9/2015 | |
| KR | 10-1640434 B | | 7/2016 | |
| KR | 10-2019-0023531 A | | 3/2019 | |
| WO | WO-8700455 A1 | * | 1/1987 | |
| WO | WO-03018860 A2 | * | 3/2003 | ......... C23C 16/4412 |
| WO | WO-2017216963 A1 | * | 12/2017 | ............... B08B 5/00 |

* cited by examiner

FLUID DISCHARGING DEVICE, SUBSTRATE PROCESSING SYSTEM INCLUDING SAME, AND FLUID DISCHARGING METHOD THEREOF

CROSS REFERENCE TO RELATED APPLICATION

The present application claims priority to Korean Patent Application No. 10-2019-0130046, filed on Oct. 18, 2019, the entire contents of which are herein incorporated by reference.

BACKGROUND OF THE INVENTION

Field of the Invention

The present disclosure relates to a fluid discharging device, a substrate processing system including the same, and a fluid discharging method thereof and, more particularly, to a fluid discharging device, a substrate processing system including the same, and a fluid discharging method thereof, the fluid discharging device being able to be used to discharge a material used in a substrate processing process.

Description of the Related Art

As semiconductor devices become high-density, high-integration, and high-performance, the miniaturization of circuit patterns has been proceeding rapidly, and pollutants such as particles, organic contaminants, and metal contaminants remaining on the surface of the substrate have a great influence on the device properties and production yield. For this reason, a cleaning process for removing various pollutants adhering to a surface of a substrate has become a very important process in semiconductor manufacturing processes, and the cleaning process of the substrate is performed in steps before and after each unit process of manufacturing a semiconductor.

In general, various chemical liquids are used to remove a photoresist, and through a chemical liquid discharging system, the chemical liquids may be discharged to a substrate. In addition, the used chemical liquids may be discharged through a discharging device coupled to a chamber.

In the case of performing a process of treating a substrate by using the chemical liquids as described above, fumes are generated from the chemical liquids. When such foreign materials such as the fumes are not smoothly discharged through the discharging device, the foreign materials remain in the chamber and contaminate the substrate, resulting in process failure.

Documents of Related Art (Patent Document 0001) Korean Patent Application Publication No. 10-2019-0023531

SUMMARY OF THE INVENTION

An objective of the present disclosure is to provide a fluid discharging device in which foreign materials may be easily removed, a substrate processing system including the same, and a fluid discharging method thereof.

According to an exemplary embodiment of the present invention, a fluid discharging device includes a body member including an entrance configured to receive fluid and a passage line through which the fluid is transferred to a chamber, and a first foreign material removing unit coupled to the body member, and expanding and restoring such that foreign materials accumulated on a surface of the first foreign material removing unit is removed.

The first foreign material removing unit includes a deformable member having an inner space and made of a deformable material, and a pressure adjusting member coupled to the deformable member and adjusting an air pressure in the inner space of the deformable member.

The pressure adjusting member repeatedly expands and restores the deformable member for a predetermined period of time.

The deformable member is made of any one selected from rubber, silicone, and synthetic resin.

The fluid discharging device further includes a pressure measuring member installed on a distal end of the passage line from the entrance and measuring a pressure of the fluid passing through the distal end of the passage line, wherein the fluid is discharged via the distal end from the passage line, and a controller operatively coupled to the pressure measuring member to receive a pressure value therefrom and enable, in response to the pressure value being greater than a reference value, the pressure adjusting member to operate.

The fluid discharging device further includes a vibration generating member attached to an outer surface of the passage line and generating vibration.

The vibration generating member operates when the pressure adjusting member expands the deformable member.

The fluid discharging device further includes a second foreign material removing unit with a deformable member installed on a closed end of the passage line and a part of the passage line which is connected to the closed end of the passage line. The closed end and the part of the passage line are proximal to the entrance of the body member.

According to an exemplary embodiment of the present invention, a substrate processing system includes a chamber providing a space in which a substrate is processed, and a fluid discharging device configured to discharge fluid generated from the chamber.

According to an exemplary embodiment of the present invention, a fluid discharging method in which fluid is discharged by a fluid discharging device which comprises a body member having a passage line through which the fluid is transferred, and a first foreign material removing unit installed inside the body member, the fluid discharging method includes monitoring a first pressure of the passage line of the body member, comparing the measured first pressure value with a reference value, and operating, in response to the measured first pressure value exceeding the reference value, the first foreign material removing unit so that a part of the first foreign material removing unit is expanded and restored to remove foreign materials on the part of the first foreign material removing unit.

The operating of the first foreign material removing unit includes expanding and restoring repeatedly a deformable member of the first foreign material removing unit for a predetermined period of time. The deformable member corresponds to the part of the first foreign material removing unit.

The fluid discharging method further includes measuring a pressure of the fluid which is discharged from the body member, adjusting, in response to the pressure of the fluid discharged from the body member being greater than the reference value, a pressure of an inner space of the deformable member, and monitoring, in response to in response to the measured first pressure value being less than or equal to the reference value, a second pressure of the passage line of the body member.

The fluid discharging method further includes vibrating the body member when the deformable member is expanded.

In addition, in a conventional fluid discharging device, operators have to clean the fluid discharging device themselves in order to remove foreign materials. However, the fluid discharging device according to the exemplary embodiment of the present disclosure automatically removes the foreign materials, thereby reducing workload required by the operators to manually remove the foreign materials.

BRIEF DESCRIPTION OF THE DRAWINGS

FIGS. 3 to 6 are views sequentially showing an operation process of the fluid discharging device, in which.

DETAILED DESCRIPTION OF THE INVENTION

Hereinafter, exemplary embodiments of the present disclosure will be described in detail with reference to the accompanying drawings so that those skilled in the art can easily implement the present disclosure. The present disclosure is not limited to the exemplary embodiments described herein and may be embodied in many different forms.

In order to clearly describe the present disclosure, parts irrelevant to the description are omitted, and the same reference numerals designate the same or similar components throughout the specification.

In addition, in various exemplary embodiments, components having the same configuration will be described only in representative exemplary embodiments by using the same reference numerals, and in other exemplary embodiments, only configurations different from the representative exemplary embodiments will be described.

Throughout the specification, when a part is said to be "connect(ed)" to another part, an expression such as "connect(ed)" is intended to include not only "direct(ly) connect(ed)" but also "indirect(ly) connect(ed)" having a different member in the middle thereof. In addition, when a part is said to "include" or "comprise" a certain component, it means that it may further include or comprise other components but not exclude other components unless the context clearly indicates otherwise.

Unless otherwise defined, all terms including technical and scientific terms used herein have the same meaning as commonly understood by one of those skilled in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
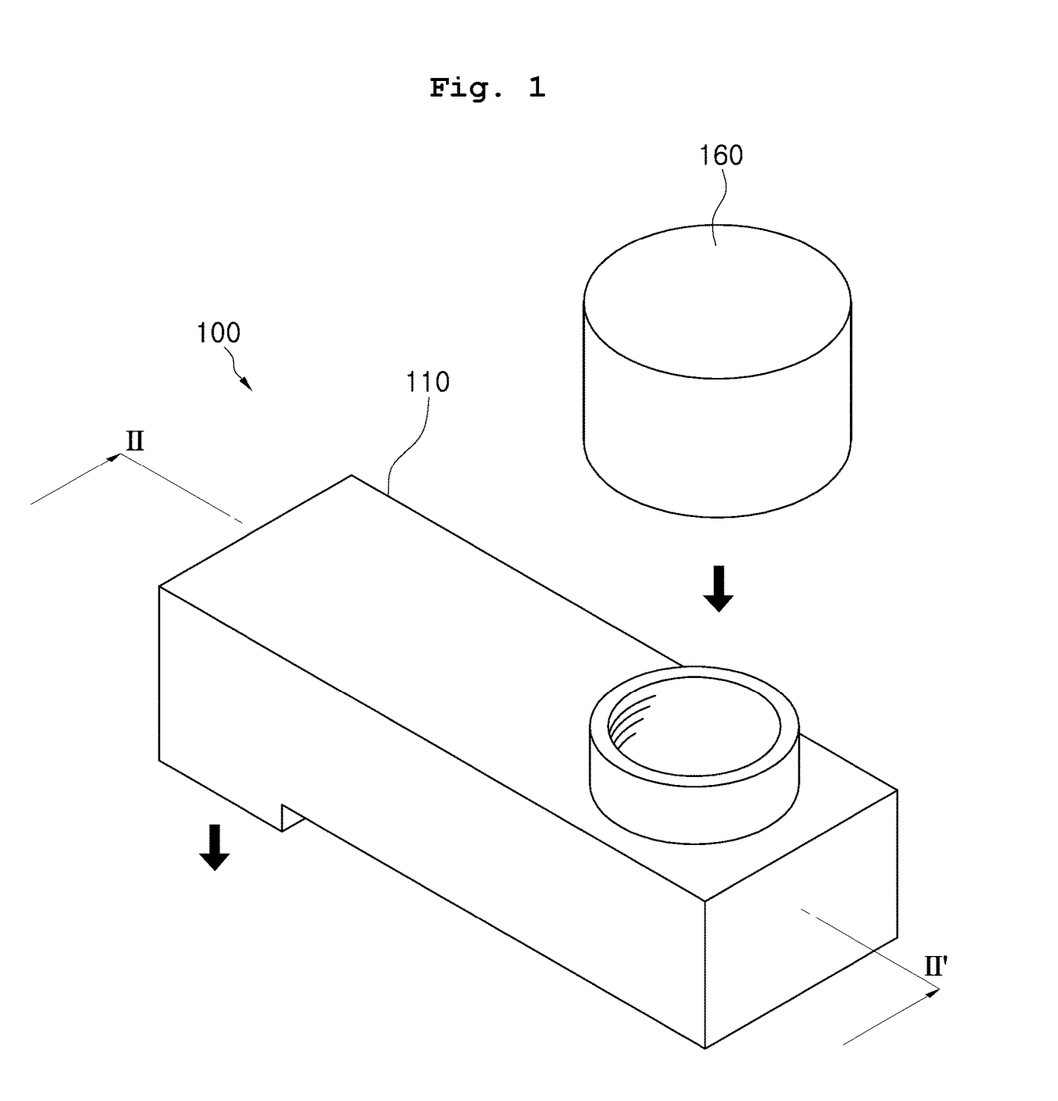
FIG. 1 is a perspective view showing a fluid discharging device according to an exemplary embodiment of the present disclosure.
Figure 2:
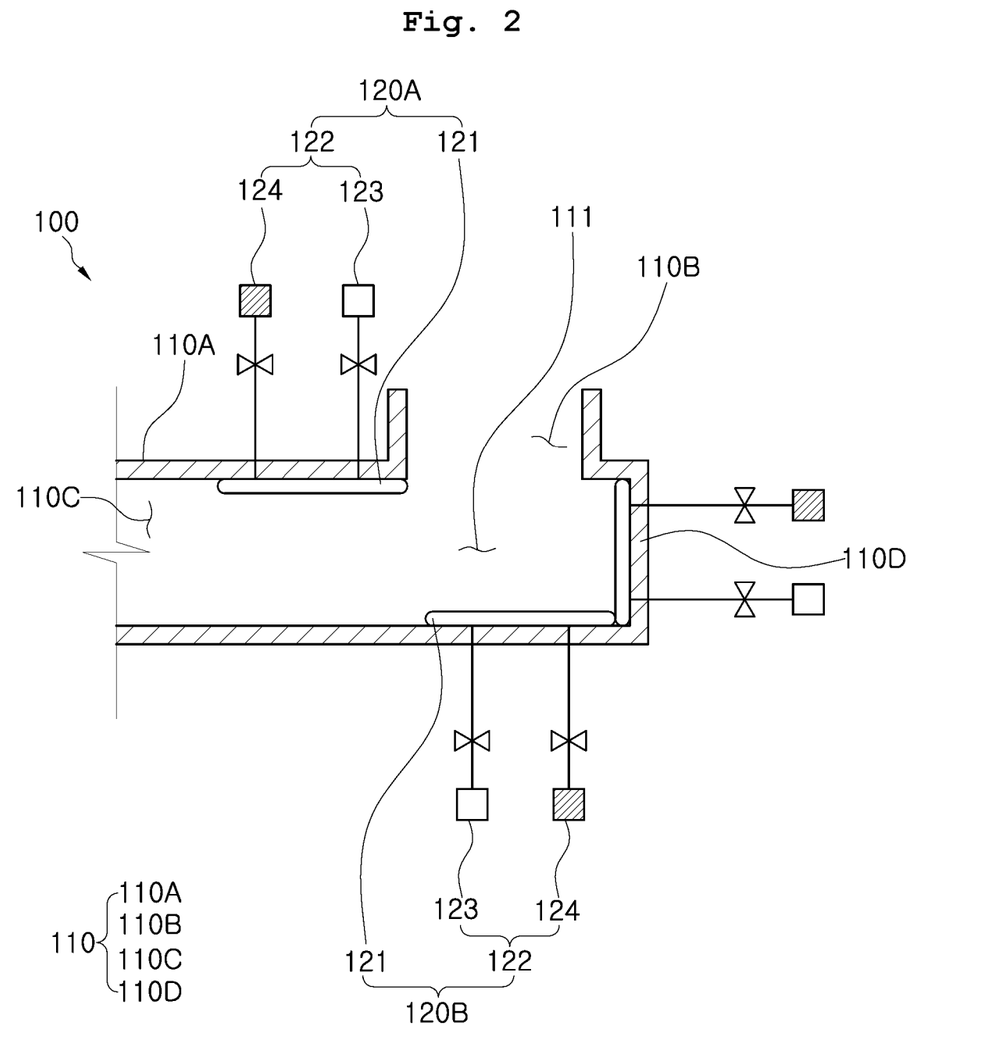
FIG. 2 is a cross-sectional view taken along the line II-II' in the fluid discharging device of FIG. 1.

Referring to FIGS. 1 and 2, a fluid discharging device 100 according to an exemplary embodiment of the present disclosure includes a body member 110 and a foreign material removing unit 120.

The body member 110 includes a passage 111 through which fluid is transferred. A processing gas used for processing a substrate, a chemical liquid used for cleaning, and the like may be transferred through the passage 111.

Fluid may be introduced through an open part of the top side of the body member 110. The arrows in FIG. 1 indicate directions in which the fluid moves. The body member 110 may be coupled to various devices constituting the substrate processing system. For example, a chamber or other devices included in a general substrate processing system may be coupled to the open part on the top side of the body member 110.

In an example embodiment, the fluid discharging device 100 may be connected to a chamber 160 to discharge the fluid therein. The fluid may be in a gaseous state or a liquid state. The body member 110 may include a passage line 110A, an entrance 110B for introducing the fluid into the passage line 110A. The passage line 110A includes an open end 110C which is distal from the entrance 110B and a closed end 110D which is proximal to the entrance 110B.

The substrate processing system according to the present disclosure includes the chamber 160 providing a space in which a substrate is processed, and the fluid discharging device 100 for discharging the fluid generated from the chamber 160. The entrance 110B of the body member 110 may be connected to the chamber 160. In addition, the substrate processing system may further include a loading/unloading part through which the substrate is carried in or taken out, and a substrate transferring part (i.e., robot) that transfers the substrate.

The foreign material removing unit 120 is installed inside the body member 110, and removes the foreign materials accumulating on the surface of the body member while a part of the foreign material removing unit is expanded and restored. There may be provided one or more foreign material removing units 120.

The foreign material removing unit 120 may include, for example, a deformable member 121 and a pressure adjusting member 122. Meanwhile, a part of the body member 110 described above may be bent.

At this time, the foreign material removing unit 120 may be installed on the bent part of the body member 110. As shown in the drawings, the foreign material removing unit may be installed on a part bent at 90 degrees in the body member 110. The bent part of the body member 110 is an area where foreign materials may easily accumulate because the flow of the fluid does not proceed smoothly.

Meanwhile, there may be provided one or more foreign material removing units 120. The plurality of foreign material removing units 120 may be installed adjacent to each other. The foreign material removing unit 120 may be possibly installed in the entire interior of the body member 110, but the foreign material removing unit installed on a part where foreign materials easily accumulate may enable reducing manufacturing cost and increasing the efficiency of removing the foreign materials.

The foreign material removing unit 120 may include a first foreign material removing unit 120A and a second foreign material removing unit 120B. The first foreign material removing unit 120A may include a deformable member installed on an inner surface of the passage line 110A. For example, the deformable member of the first foreign material removing unit 120A is located near the entrance 110B of the body member 110. In an example embodiment, the deformable member of the first foreign material removing unit 120A may extend along a direction in which the passage line 110A extends. The second foreign material removing unit 120B may include a deformable member installed on the bent part of the body member 110 in which the closed end 110D of the passage line 110A and a part of the passage line 110A meet each other at 90 degrees, for example. The part of the passage line 110A may be connected to the closed end 110D of the passage line 110A and opposite to the entrance of the body member 110. In an example embodiment, the closed end 110D of the passage line 110A and the part of the passage line 110A may be located proximal to the entrance 110B of the body member 110. In an example embodiment, the deformable member of the second foreign material removing unit 120B may include a first deformable member on the closed end 110D and a second deformable member on the part of the passage line 110A.

The deformable member 121 has an inner space and may be made of a material capable of being deformed. The deformable member 121 may have a shape corresponding to an inner wall surface of the body member 110.

The deformable member 121 may be a material capable of being freely defamed by an external force. The deformable member 121 may be made of any one selected from rubber, silicone, and synthetic resin. The deformable member 121 may be fixed to the inner wall surface of the body member 110 or the closed end 110D of the body member 110 by an adhesive material or a separate bracket. In an example embodiment, the second foreign material removing unit 120B may include the first deformable member on the closed end 110D of the passage line 110A and the second deformable member on the part of the passage line 110A. In an example embodiment, the first deformable member and the second deformable member may be connected to each other so that they expand and restore together to remove the foreign materials on the first deformable member and the second deformable member. The foreign materials removed from the deformable members may be discharged via the open end 110C of the passage line 110A.

The pressure adjusting member 122 is disposed outside the body member 110 and adjusts air pressure in the inner space of the deformable member 121. The pressure adjusting member 122 may repeatedly expand and restore the deformable member 121 for a predetermined period of time.

The pressure adjusting member 122 for this purpose may include, for example, a vacuum pump 123 and an air compressor 124. The air compressor 124 is connected to the deformable member 121 and supplies air to the deformable member 121. The deformable member 121 may be expanded by the supplied air.

The vacuum pump 123 is connected to the deformable member 121 and may discharge the air inside the deformable member 121. Accordingly, the deformable member 121 may be restored to an initial state before being expanded by the air.

A process in which foreign materials are removed by such a foreign material removing unit 120 will be described as follows. The deformable member 121 maintains an initial state. The initial state refers to a state in which air is not injected into the deformable member 121 and thus the deformable member 121 is not expanded.

Figure 3:
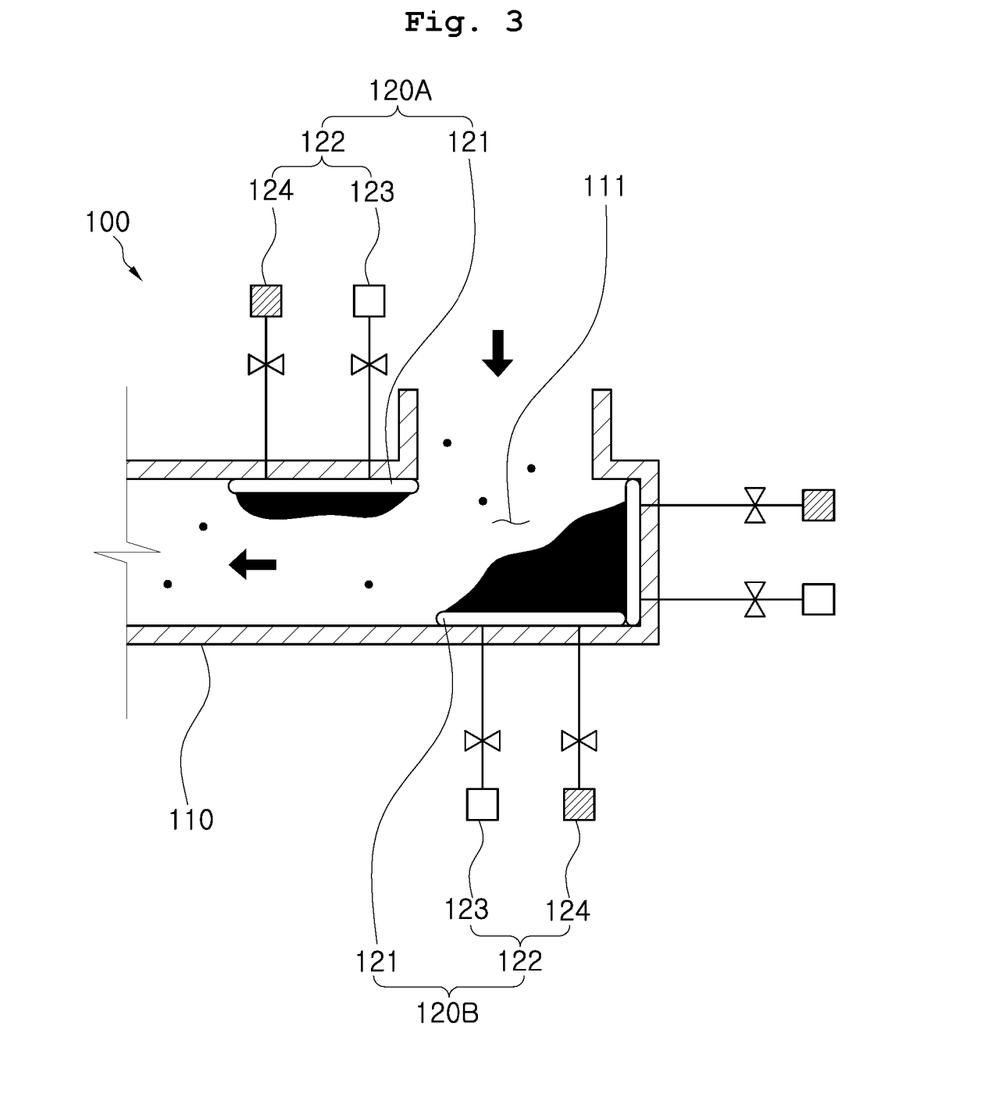
FIG. 3 is a view showing a state in which foreign materials are accumulated in a passage.

As shown in FIG. 3, when the fluid discharging device 100 according to the exemplary embodiment of the present disclosure discharges fluid, pollutants such as fumes may accumulate on a surface of a deformable member 121. At this time, the pollutants may be hardened and adhered to the surface of the deformable member 121.

Figure 4:
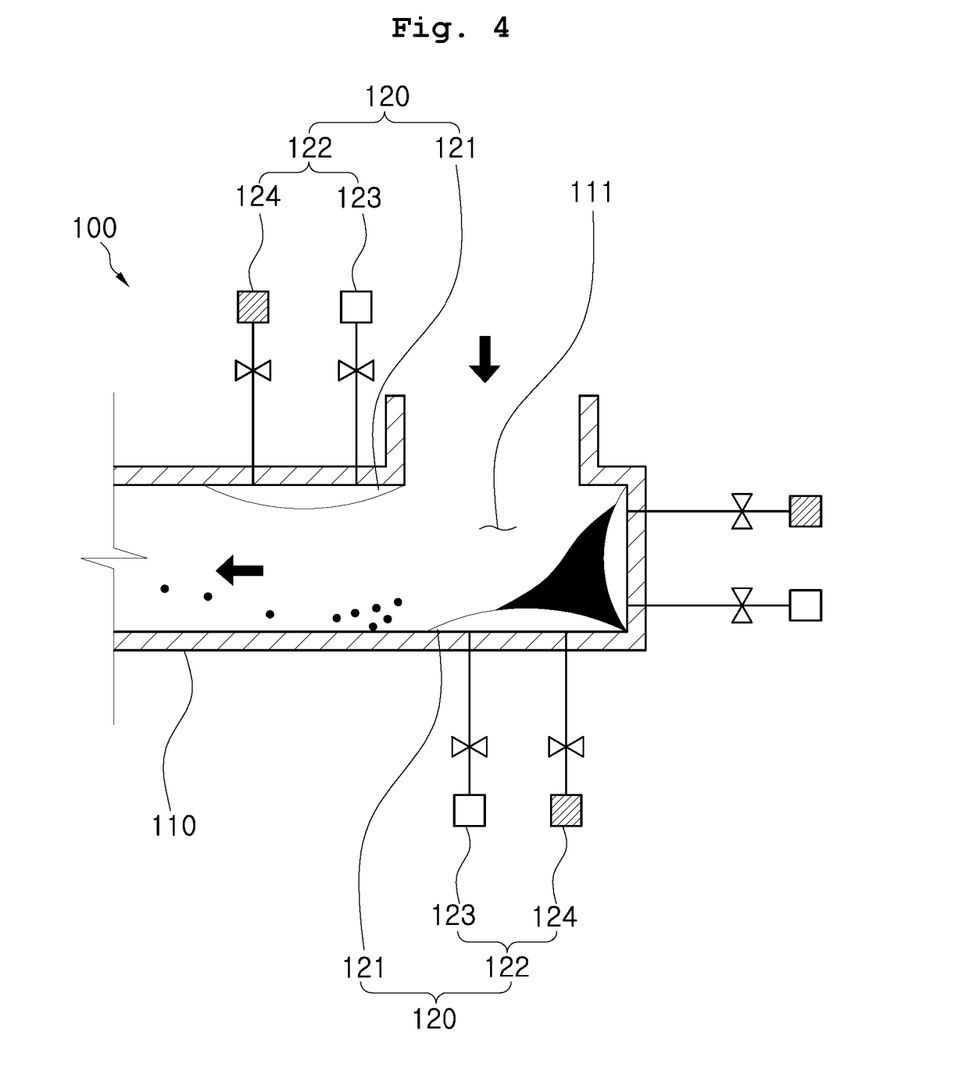
FIG. 4 is a view showing a state in which a deformable member is expanded.

As shown in FIG. 4, a foreign material removing unit 120 starts operation. A pressure adjusting member 122 injects air into the deformable member 121. The deformable member 121 is expanded, and the pollutants that have been hardened are separated from the deformable member 121, so that the pollutants may be discharged together with the fluid transferred through the passage 111 of the body member 110. Such a foreign material removing unit 120 may be set to operate periodically at a predetermined time.

For example, in the fluid discharging device 100 according to the exemplary embodiment of the present disclosure, in the case where it is confirmed through an experiment that a significant amount of foreign materials accumulates when the fluid discharging device is operated for about 100 hours, the foreign material removing unit 120 may be set to operate every 90 hours. Since a time period in which the foreign material removing unit 120 is operated may be changed according to a design, the time period is not limited to a specific time.

Figure 5:
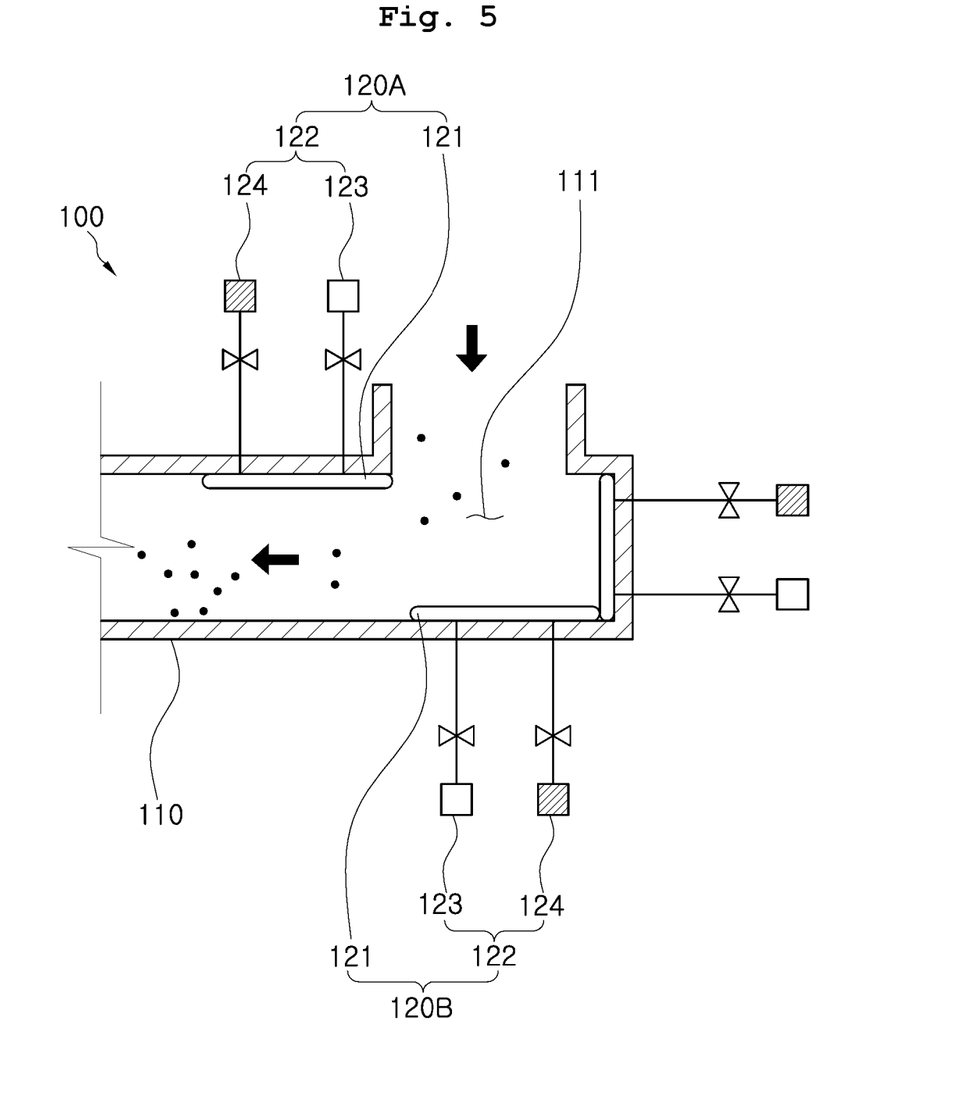
FIG. 5 is a view showing a process of removing the foreign materials in the passage.
Figure 6:
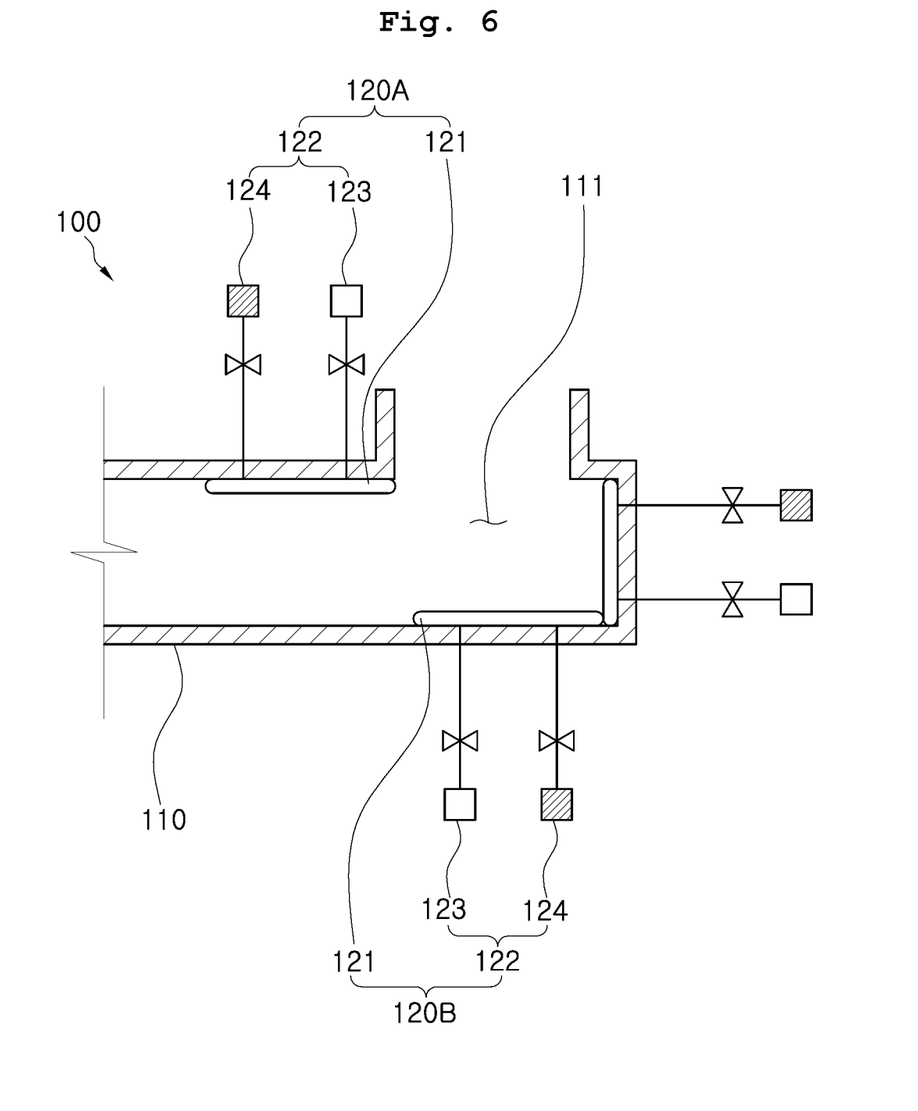
FIG. 6 is a view showing a state in which all foreign materials have been removed.

As shown in FIG. 5, when the same process as above is repeatedly performed, many foreign materials inside the body member 110 may be discharged together with the fluid. Finally, as shown in FIG. 6, all foreign materials inside the body member 110 may be removed.

The fluid discharging device 100 according to the exemplary embodiment of the present disclosure may automatically remove foreign materials even though a user does not additionally perform operation of removing the foreign materials. Accordingly, the foreign material removing unit 120 prevents excessive growth of foreign materials such as fumes, thereby facilitating a smooth flow of the fluid and preventing a pressure increase in the passage 111.

In addition, in the case where a conventional fluid discharging device is installed in the substrate processing system, the operators should periodically clean the fluid discharging device themselves in order to remove foreign materials. However, the fluid discharging device 100 according to the exemplary embodiment of the present disclosure automatically removes the foreign materials, thereby reducing the workload required by the operators to manually remove the foreign materials.

Figure 7:
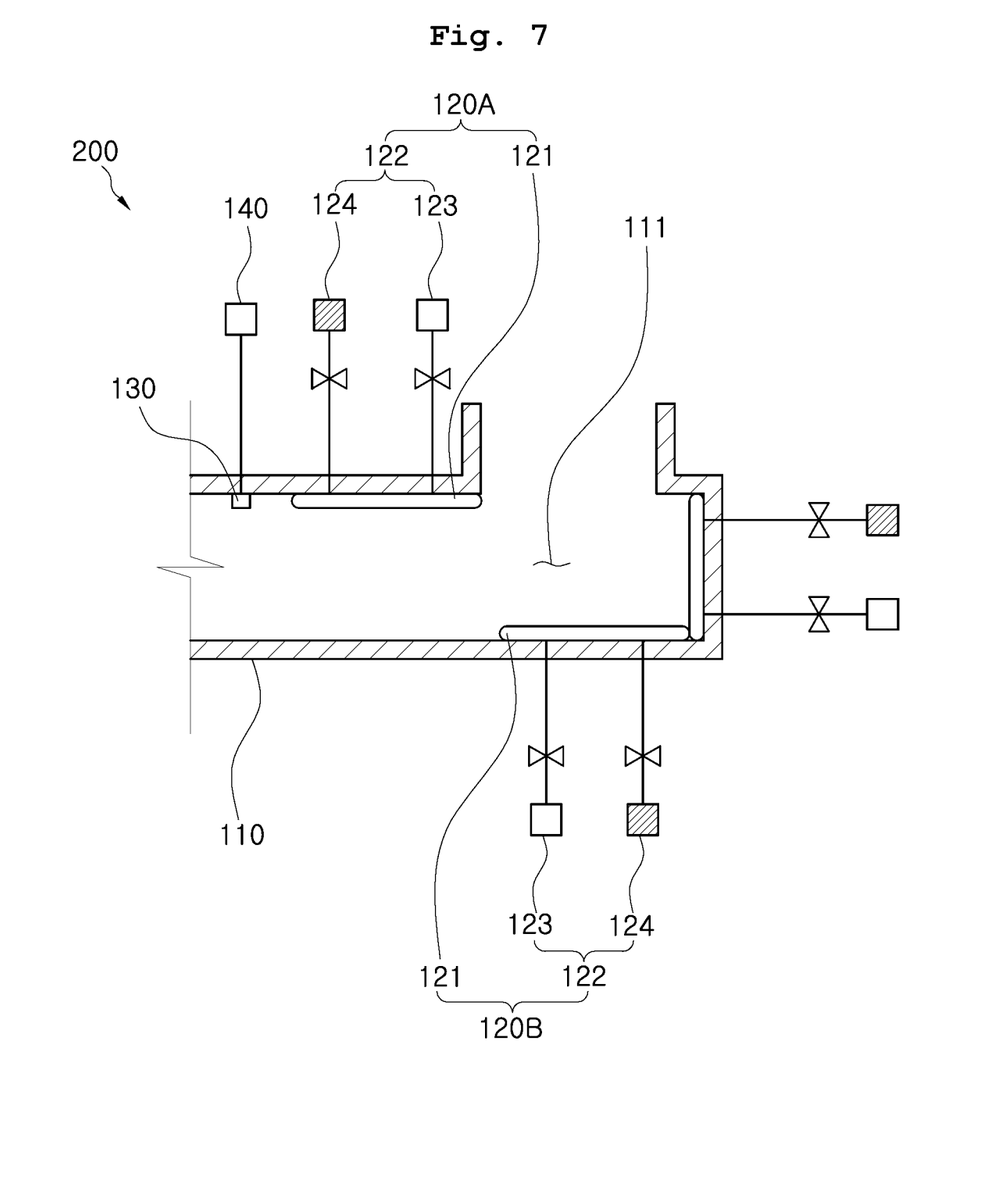
FIG. 7 is a view showing a fluid discharging device according to another exemplary embodiment of the present disclosure.

Meanwhile, referring to FIG. 7, the fluid discharging device 200 according to another exemplary embodiment of the present disclosure may further include a pressure measuring member 130 and a controller 140.

The pressure measuring member 130 is installed on a part where fluid is discharged from the body member 110. The pressure measuring member 130 may measure an ambient pressure. That is, the pressure measuring member 130 measures pressure at the rear end where the fluid is discharged from the body member 110. For example, the pressure measuring member 130 may be installed near a distal end (i.e., the open end 110C) of the passage line 110A from the entrance 110B. The distal end is open so that the fluid is discharged from the passage line 110A. In an example embodiment, the pressure measuring member 130 may measure a pressure of the discharged fluid passing through the open end 110C of the passage line 110A.

When a pressure value measured by the pressure measuring member 130 is greater than a reference value, the controller 140 enables the pressure adjusting member 122 to be operated. The reference value may be a value obtained through repeated experiments.

In addition, the reference value may be a pressure value inside the body member 110 just before foreign materials accumulate in a considerable amount and interfere with the flow of the fluid, and is not limited to a specific value. That is, the fact that the pressure value measured by the pressure measuring member 130 is greater than the reference value may indicate that a considerable amount of foreign materials has accumulated in the body member 110.

The controller 140 may enable the pressure adjusting member 122 to operate before the foreign materials accumulate excessively inside the body member 110.

Meanwhile, in the case where foreign materials gradually accumulate inside the body member in the fluid discharging device not including the aforementioned foreign material removing unit 120, the pressure at the rear end of the body member increases, and the discharge speed of the fluid may be further slowed. When this happens, more and more foreign materials may accumulate thereon.

In particular, when the flow of the fluid does not proceed smoothly in the passage, the foreign materials grow rapidly while accumulating, and the fluid may not be smoothly discharged through the passage, thereby causing process failure.

However, the pressure measuring member 130 included in the fluid discharging device 200 according to another exemplary embodiment of the present disclosure measures the pressure at the rear end of the body member 110 in real time, and transfers a pressure value to the controller 140. In addition, the controller 140 operates the pressure adjusting member 122 on the basis of the pressure value.

As described above, in the fluid discharging device 200 according to another exemplary embodiment of the present disclosure, unlike the fluid discharging device 100 (refer to FIG. 2) according to the above-described exemplary embodiment, the foreign material removing unit 120 is not periodically operated, but may be operated in response to the amount of foreign materials accumulating thereon. That is, when the foreign materials accumulate in a small amount, the foreign material removing unit 120 is not operated, and when the foreign materials accumulate in an appropriate amount, the foreign material removing unit 120 may be operated. Accordingly, it is possible to reduce power consumption by minimizing unnecessary frequent operation of the foreign material removing unit 120.

In addition, since the fluid discharging device 200 according to another exemplary embodiment of the present disclosure may be relatively able to reduce the number of operations of the foreign material removing unit 120 compared to that of the fluid discharging device 100 according to the above-described exemplary embodiment (refer to FIG. 2), it is possible to increase the life of the foreign material removing unit 120.

Figure 8:
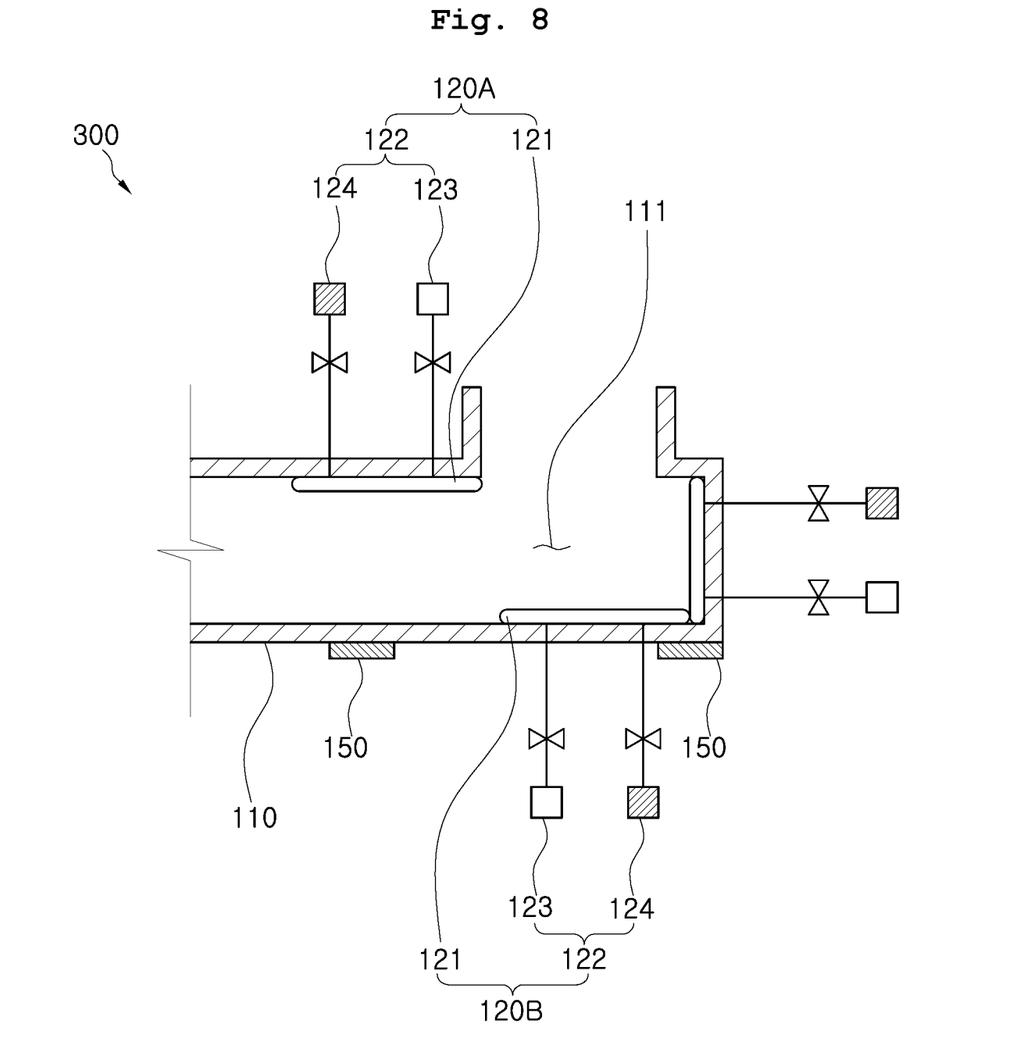
FIG. 8 is a view showing a fluid discharging device according to still another exemplary embodiment of the present disclosure.

Meanwhile, referring to FIG. 8, a fluid discharging device 300 according to still another exemplary embodiment of the present disclosure may further include a vibration generating member 150.

The vibration generating member 150 is coupled to the body member 110 and generates vibration. The vibration generating member 150 may be operated when the pressure adjusting member 122 expands the deformable member 121. In the drawings, the vibration generating member 150 is shown as being installed outside the body member 110, but is not limited thereto, and it is possible for the vibration generating member 150 to be installed inside the body member 110.

Such a vibration generating member 150 generates the vibration in the process of operating the foreign material removing unit 120, so that the foreign materials adhered to the deformable member 121 may be more smoothly separated therefrom.

The process S100 (refer to FIG. 9) of operating the fluid discharging device according to another exemplary embodiment of the present disclosure including the controller 140 and the pressure measuring member 130 will be described with reference to the drawings.

Hereinafter, a fluid discharging method for discharging the fluid by using the fluid discharging device 200 (refer to FIG. 7) including the pressure measuring member 130 (refer to FIG. 7) and the controller 140 (refer to FIG. 7) described above will be explained.

Figure 9:
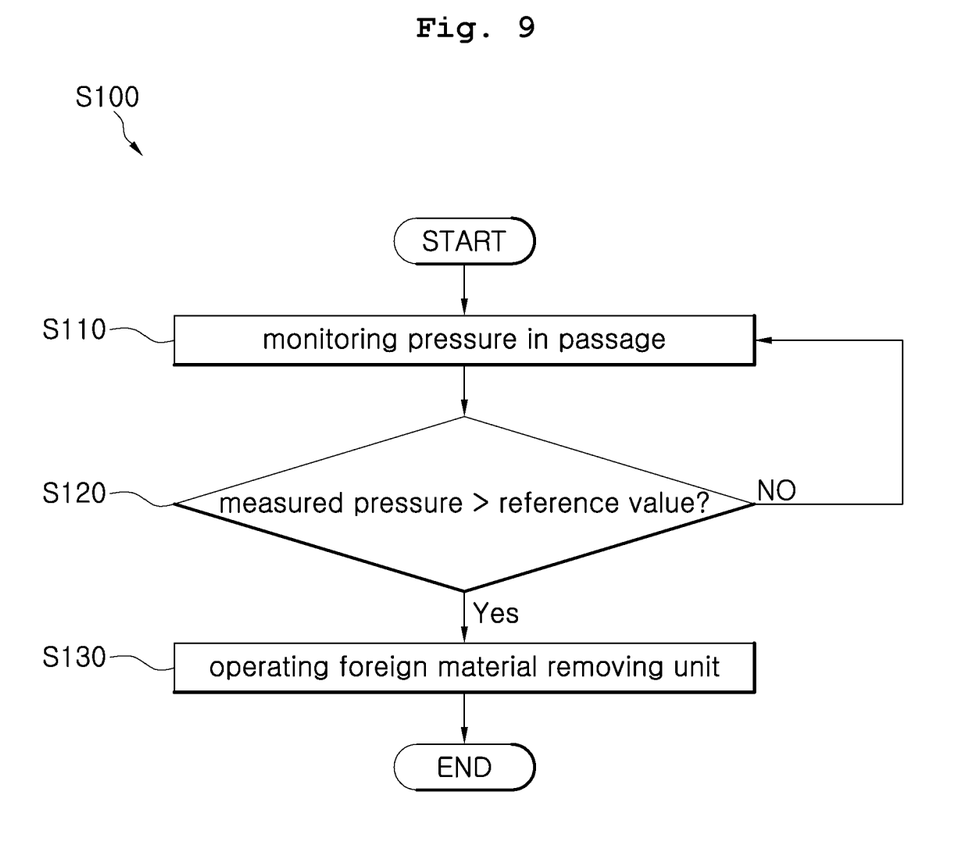
FIG. 9 is a flowchart showing a fluid discharging method according to the exemplary embodiment of the present disclosure.

Referring to FIG. 9, the fluid discharging method S100 according to the exemplary embodiment of the present disclosure includes: monitoring pressure of a passage of a body member in real time (i.e., a step of monitoring S110); comparing a measured pressure value with a reference value (i.e., a step of comparison S120); and operating a foreign material removing unit when the measured pressure value exceeds the reference value (i.e., a step of operation S130).

In the step of monitoring S110, the pressure at the lower end part of the passage of the body member 110 is monitored in real time by the pressure measuring member 130. The measured pressure value may be transmitted to the controller 140. According to the exemplary embodiment of the present disclosure, when the pressure measured by the pressure measuring member 130 is less than or equal to the reference value, the fluid discharging method is set to continue monitoring the pressure of the passage of the body member 110.

In the step of comparison S120, the controller may compare the measured pressure value with the reference value. At this time, when the measured pressure value is less than or equal to the reference value, the foreign material removing unit is not operated, and the step of comparison S120 may be returned to the step of monitoring S110 in which the pressure of the passage is continually monitored in real time by the pressure measuring member 130.

The step of operation S130 is a step in which the controller operates the pressure adjusting member. When the measured pressure value exceeds the reference value, the step of operation S130 may be performed. At this time, the deformable member 121 may expand and restore several times, and the foreign materials may be quickly separated from the surface of the deformable member 121.

According to the exemplary embodiment of the present disclosure, the step of operation S130 of operating the foreign material removing unit 120 may include expanding and restoring the deformable member 121 repeatedly for a predetermined time.

In addition, the fluid discharging method S100 according to the exemplary embodiment of the present disclosure may further include operating the vibration generating member 150 when the pressure adjusting member 122 expands the deformable member 121.

Since the fluid discharging method S100 has already been described while explaining the above-described fluid discharging device 200 (refer to FIG. 7), a detailed description thereof will be omitted.

Although various exemplary embodiments of the present disclosure have been described above, the drawings referenced so far and the detailed description of the disclosure are merely illustrative of the present disclosure, which are only used for the purpose of describing the present disclosure, and It is not used to limit the meaning or to limit the scope of the present disclosure described in the claims. Accordingly, those skilled in the art will appreciate that various modifications and other equivalent embodiments are possible. Therefore, the true technical protection scope of the present disclosure will be defined by the technical spirit of the appended patent claims.

What is claimed is:

1. A fluid discharging device comprising:
   a body member including an entrance configured to receive fluid and a passage line through which the fluid is transferred to a chamber,
   wherein the passage line includes an open end, a closed end, and a side surface extending from the closed end toward the open end in a first direction, and
   wherein the entrance is connected to the side surface of the passage line in a second direction perpendicular to the first direction;
   a first foreign material removing unit coupled to an inside of the passage line of the body member and configured to expand and restore such that foreign materials accumulated on a surface of the first foreign material removing unit is removed;
   a pressure measuring member installed at the inside of the passage line and at a distal end of the passage line from the entrance and configured to measure a pressure of the fluid passing through the distal end of the passage line, wherein the fluid is discharged via the distal end from the passage line; and
   a controller operatively coupled to the pressure measuring member to receive a pressure value therefrom and enable, in response to the pressure value being greater than a reference value, the first foreign material removing unit to operate.

2. The fluid discharging device of claim 1,
   wherein the first foreign material removing unit comprises:
   a deformable member having an inner space and made of a deformable material; and
   a pressure adjusting member coupled to the deformable member and configured to adjust an air pressure in the inner space of the deformable member.

3. The fluid discharging device of claim 2,
   wherein the pressure adjusting member is configured to repeatedly expand and restore the deformable member for a predetermined period of time.

4. The fluid discharging device of claim 2,
   wherein the deformable member is made of any one selected from rubber, silicone, and synthetic resin.

5. The fluid discharging device of claim 2,
   wherein the controller operatively coupled to the pressure measuring member to receive a pressure value therefrom and enable, in response to the pressure value being greater than a reference value, the pressure adjusting member of the first foreign material removing unit to operate.

6. The fluid discharging device of claim 2, further comprising:
   a vibration generating member attached to an outer surface of the passage line and configured to generate vibration.

7. The fluid discharging device of claim 6,
   wherein the vibration generating member is configured to operate when the pressure adjusting member expands the deformable member.

8. The fluid discharging device of claim 1, further comprising:
   a second foreign material removing unit with a deformable member installed on a closed end of the passage line and a part of the passage line which is connected to the closed end of the passage line,
   wherein the closed end and the part of the passage line are proximal to the entrance of the body member.

9. A substrate processing system comprising:
   a chamber providing a space in which a substrate is processed; and
   a fluid discharging device configured to discharge fluid generated from the chamber,
   wherein the fluid discharging device comprises:
   a body member including an entrance configured to receive fluid and a passage line through which the fluid is transferred to a chamber,
   wherein the passage line includes an open end, a closed end, and a side surface extending from the closed end toward the open end in a first direction, and
   wherein the entrance is connected to the side surface of the passage line in a second direction perpendicular to the first direction;
   a first foreign material removing unit coupled to an inside of the passage line of the body member and configured to expand and restore such that foreign materials accumulated on a surface of the first foreign material removing unit is removed;
   a pressure measuring member installed at the inside of the passage line and at a distal end of the passage line from the entrance and configured to measure a pressure of the fluid passing through the distal end of the passage line, wherein the fluid is discharged via the distal end from the passage line; and
   a controller operatively coupled to the pressure measuring member to receive a pressure value therefrom and enable, in response to the pressure value being greater than a reference value, the first foreign material removing unit to operate.

10. The substrate processing system of claim 9,
    wherein the first foreign material removing unit comprises:
    a deformable member having an inner space and made of a deformable material; and
    a pressure adjusting member coupled to the deformable member and configured to adjust an air pressure in the inner space of the deformable member.

11. The substrate processing system of claim 10,
    wherein the pressure adjusting member is configured to repeatedly expand and restore the deformable member for a predetermined period of time.

12. The substrate processing system of claim 10,
    wherein the deformable member is made of any one selected from rubber, silicone, and synthetic resin.

13. The substrate processing system of claim 10,
    wherein the controller enables the pressure adjusting member to operate when a pressure value measured by the pressure measuring member is greater than a reference value.

14. The substrate processing system of claim 10, further comprising:
  a vibration generating member attached to an outer surface of the passage line and configured to generate vibration.

15. The substrate processing system of claim 14, wherein the vibration generating member is configured to operate when the pressure adjusting member expands the deformable member.

16. The substrate processing system of claim 9, further comprising:
  a second foreign material removing unit with a deformable member installed on a closed end of the passage line and a part of the passage line which is connected to the closed end of the passage line,
  wherein the closed end and the part of the passage line are proximal to the entrance of the body member.

17. A fluid discharging method in which fluid is discharged by the fluid discharging device of claim 1, the fluid discharging method comprising:
  monitoring a first pressure of fluid flowing through the passage line of the body member;
  comparing the measured first pressure value with a reference value; and
  operating, in response to the measured first pressure value exceeding the reference value, the first foreign material removing unit so that a part of the first foreign material removing unit is expanded and restored to remove foreign materials on the part of the first foreign material removing unit.

18. The fluid discharging method of claim 17, wherein the operating of the first foreign material removing unit comprises:
  expanding and restoring repeatedly a deformable member of the first foreign material removing unit for a predetermined period of time,
  wherein the deformable member corresponds to the part of the first foreign material removing unit.

19. The fluid discharging method of claim 18, further comprising:
  measuring a pressure of the fluid which is discharged from the body member;
  adjusting, in response to the pressure of the fluid discharged from the body member being greater than the reference value, a pressure of an inner space of the deformable member; and
  monitor, in response to in response to the measured first pressure value being less than or equal to the reference value, a second pressure of the passage line of the body member.

20. The fluid discharging method of claim 18, further comprising:
  vibrating the body member when the deformable member is expanded.

* * * * *